United States Patent
Ang

(10) Patent No.: US 8,026,151 B2
(45) Date of Patent: Sep. 27, 2011

(54) METHOD WITH HIGH GAPFILL CAPABILITY FOR SEMICONDUCTOR DEVICES

(75) Inventor: Ting Cheong Ang, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 51 days.

(21) Appl. No.: 12/273,323

(22) Filed: Nov. 18, 2008

(65) Prior Publication Data

US 2009/0075454 A1    Mar. 19, 2009

Related U.S. Application Data

(63) Continuation of application No. 11/539,612, filed on Oct. 6, 2006, now Pat. No. 7,456,067.

(30) Foreign Application Priority Data

May 26, 2006 (CN) .......................... 2006 1 0027042

(51) Int. Cl.
*H01L 21/00* (2006.01)

(52) U.S. Cl. ........ 438/424; 438/427; 438/436; 438/692; 438/702; 257/E21.546; 257/E21.549

(58) Field of Classification Search .................. 438/400, 438/424–437, 692–702; 257/E21.546–549
See application file for complete search history.

(56) References Cited

U.S. PATENT DOCUMENTS

| | | | | |
|---|---|---|---|---|
| 5,970,362 A | * | 10/1999 | Lyons et al. | 438/424 |
| 6,037,237 A | * | 3/2000 | Park et al. | 438/424 |
| 6,048,775 A | | 4/2000 | Yao et al. | |
| 6,107,143 A | * | 8/2000 | Park et al. | 438/296 |
| 6,180,490 B1 | * | 1/2001 | Vassiliev et al. | 438/424 |
| 6,228,742 B1 | * | 5/2001 | Yew et al. | 438/400 |
| 6,319,788 B1 | | 11/2001 | Gruening et al. | |
| 6,350,661 B2 | | 2/2002 | Lim et al. | |

(Continued)

FOREIGN PATENT DOCUMENTS

CN    1531057 A    9/2004

OTHER PUBLICATIONS

Notice of Allowance for U.S. Appl. No. 11/539,612, mailed on Jul. 25, 2008, 7 pages.

(Continued)

*Primary Examiner* — Michael S Lebentritt
(74) *Attorney, Agent, or Firm* — Kilpatrick Townsend and Stockton LLP

(57) ABSTRACT

A method of performing an STI gapfill process for semiconductor devices is provided. In a specific embodiment of the invention, the method includes forming an stop layer overlying a substrate. In addition, the method includes forming a trench within the substrate, with the trench having sidewalls, a bottom, and a depth. The method additionally includes forming a liner within the trench, the liner lining the sidewalls and bottom of the trench. Furthermore, the method includes filling the trench to a first depth with a first oxide. The first oxide is filled using a spin-on process. The method also includes performing a first densification process on the first oxide within the trench. In addition, the method includes depositing a second oxide within the trench using an HDP process to fill at least the entirety of the trench. The method also includes performing a second densification process on the first and second oxides within the trench.

12 Claims, 14 Drawing Sheets

U.S. PATENT DOCUMENTS

| | | |
|---|---|---|
| 6,387,764 B1 | 5/2002 | Curtis et al. |
| 6,468,853 B1 | 10/2002 | Balasubramanian et al. |
| 6,528,386 B1 | 3/2003 | Summerfelt et al. |
| 6,559,033 B1 | 5/2003 | Hu et al. |
| 6,627,506 B2 | 9/2003 | Kuhn et al. |
| 6,683,354 B2 * | 1/2004 | Heo et al. .................. 257/397 |
| 6,756,654 B2 * | 6/2004 | Heo et al. .................. 257/510 |
| 7,456,067 B2 | 11/2008 | Ang |
| 2004/0038493 A1 | 2/2004 | Shih |
| 2005/0186755 A1 | 8/2005 | Smythe, III et al. |

OTHER PUBLICATIONS

Office Action of Chinese Application No. 200610027042.X dated Jul. 11, 2008, 7 pages total (English translation not included).

* cited by examiner

METHOD WITH HIGH GAPFILL CAPABILITY FOR SEMICONDUCTOR DEVICES

CROSS-REFERENCES TO RELATED APPLICATIONS

This application is a continuation of U.S. patent application Ser. No. 11/539,612, filed Oct. 6, 2006, which application claims priority to Chinese Patent Application Serial No. 200610027042.x, filed May 26, 2006, commonly assigned and of which is incorporated by reference herein for all purposes.

BACKGROUND OF THE INVENTION

The present invention is directed to integrated circuits and their processing for the manufacture of semiconductor devices. More particularly, the invention provides a CVD deposition method with high gapfill capability that can fill trenches with a width 0.10 µm or smaller. Merely by way of example, the invention has been applied to making shallow trench isolation (STI) regions. But it can be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. Additionally, as devices require faster and faster designs, process limitations exist with conventional processes and materials.

One such example of a process limitation deals with the difficulty of filling a trench that has a high aspect ratio, meaning that the ratio of the depth of the trench to the trench opening is large. A high aspect ratio can cause problems during the trench fill process in that the deposited material is not uniformly distributed over the surface area of the trench, leading to overhang of the deposited material at the trench corner and voids at the center of the trench. This can lead to problems with device performance and electrical reliability.

From the above, it is seen that an improved technique for processing semiconductor devices is desired.

BRIEF SUMMARY OF THE INVENTION

The present invention is directed to integrated circuits and their processing for the manufacture of semiconductor devices. More particularly, the invention provides a CVD deposition method with high gapfill capability that can fill trenches with a width 0.10 µm or smaller. Merely by way of example, the invention has been applied to making shallow trench isolation (STI) regions. But it can be recognized that the invention has a much broader range of applicability.

In a specific embodiment of the invention, a method of performing an STI gapfill process for semiconductor devices is provided. The method includes forming an stop layer overlying a substrate. In addition, the method includes forming a trench within the substrate, with the trench having sidewalls, a bottom, and a depth. The method additionally includes forming a liner within the trench, the liner lining the sidewalls and bottom of the trench. Furthermore, the method includes filling the trench to a first depth with a first oxide. The first oxide is filled using a spin-on process. The method also includes performing a first densification process on the first oxide within the trench. In addition, the method includes depositing a second oxide within the trench using an HDP process to fill at least the entirety of the trench. The method also includes performing a second densification process on the first and second oxides within the trench.

In another embodiment of the present invention, an STI gapfill process for semiconductor devices is provided. The method includes forming an stop layer and pad oxide layer overlying a substrate. The method also includes forming a trench within the substrate, with the trench having sidewalls, a bottom, and a depth. In addition, the method includes forming a liner within the trench, with the liner lining the sidewalls and bottom of the trench. Furthermore, the method includes filling the trench to a first depth with a first oxide using a spin-on process. In addition, the method includes performing a first densification process on the first oxide. The first densification process is performed within an $N_2$ and/or $O_2$ ambient at a temperature between 400-800 degrees C. for a duration between 30 seconds to 30 minutes. The method also includes depositing a second oxide within the trench using an HDP process to fill the entirety of the trench. In addition, the method includes performing a second densification process on the first and second oxides. The second densification process is performed within an $N_2$ and/or $O_2$ ambient at a temperature between 850-1100 degrees C. for a duration between 30 seconds to 30 minutes. Furthermore, the method includes performing a planarization process on the first and second oxides which stops at the stop layer. The method also includes removing the stop layer.

Many benefits are achieved by way of the present invention over conventional techniques. For example, the present technique provides an easy to use process that relies upon conventional technology. In some embodiments, an effective gapfill process is provided which improves the device reliability and performance of a semiconductor circuit. Additionally, embodiments of the invention provide a gapfill method that is capable of filling trenches with a width of 0.10 µm or smaller with no voiding. In addition, oxide films of a compressive or tensile strength may be selectively created using embodiments of the invention. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a CVD deposition method with high gapfill capability that can fill trenches with a width 0.10 μm or smaller. Merely by way of example, the invention has been applied to making shallow trench isolation (STI) regions. But it can be recognized that the invention has a much broader range of applicability.

Figure 1A:
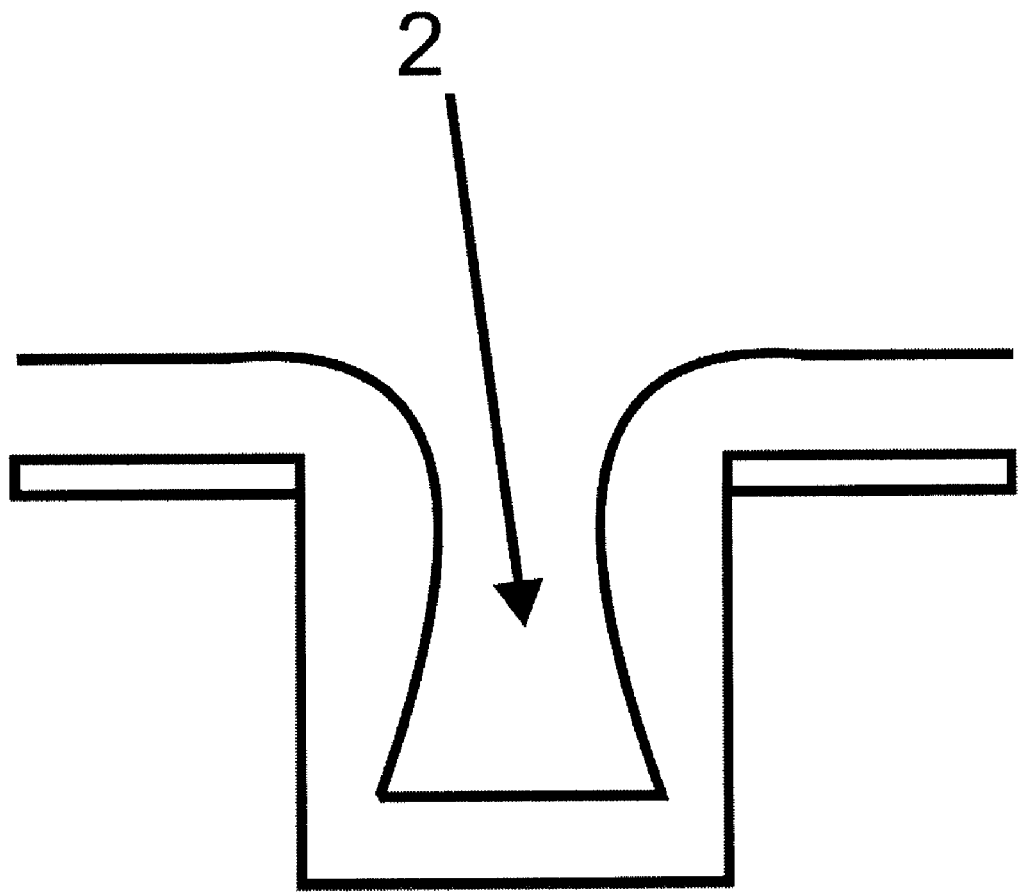
FIG. 1A is a simplified drawing showing void formation following a conventional deposition process.
Figure 1B:
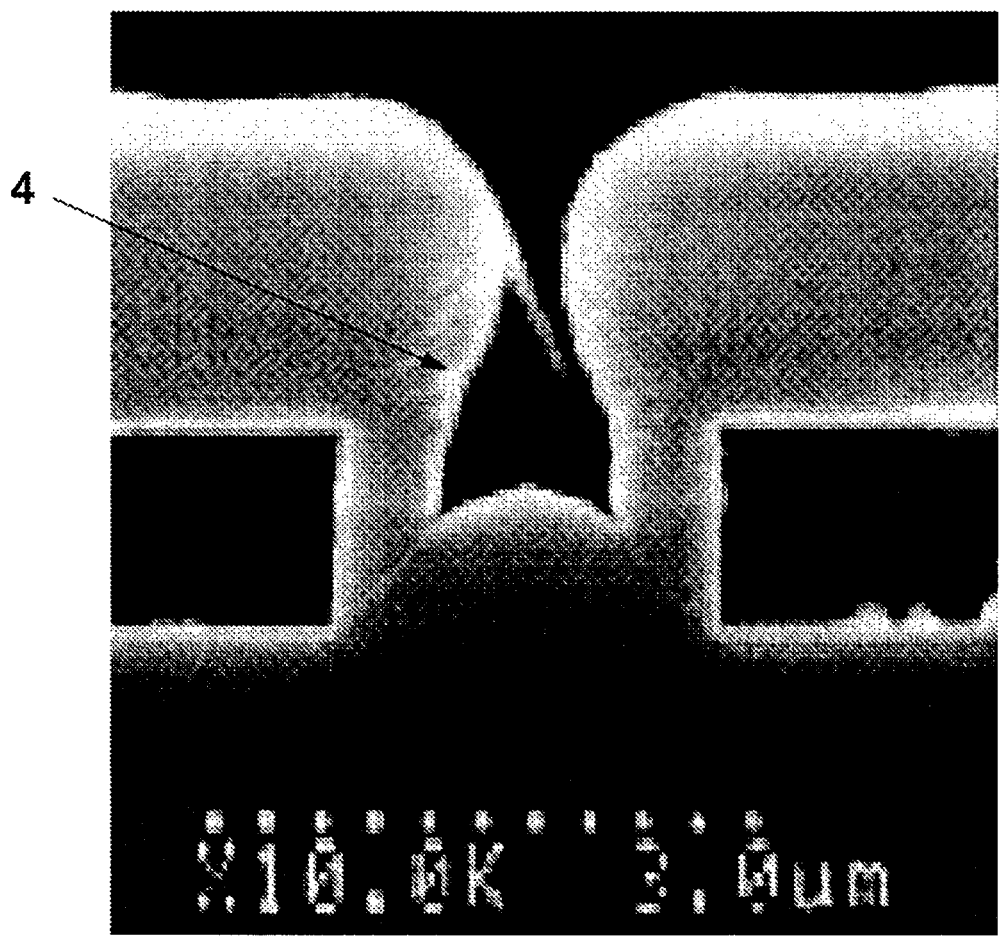
FIG. 1B is a SEM image of void formation in a conventional STI process.

FIG. 1A is a simplified drawing showing void formation in a conventional trench filling process and FIG. 1B is a SEM image of void formation in a conventional STI process. A deposition process may be used to fill the high aspect ratio trenches formed within the substrate. For example, a high aspect ratio trench is a trench where the ratio of the trench depth to the trench width is at least than 5:1. A trench with exemplary dimensions of a trench opening of 12 microns and a depth of 5000 Å can incur a number of problems when performing a deposition process. One major problem that can occur is that overhang of the deposited material on the top corners of the trench can cause voids to form in the deposited material. For example, the inventor has discovered that this occurs because a larger amount of the deposited material collects on the corners of the trench instead of being evenly distributed throughout the trench. As material collects on the corners of the trench, it encroaches into the trench opening and causes more and more material to be deposited on the trench corners. More specifically, the trench aperture may have a reentrant angle whereby the upper width of the aperture is smaller than the bottom width of the trench. This causes voids 2 and 4 to form within the central portion of the trench, which can result in increased resistance in the deposited film, reliability problems of integrated circuits being formed by the structure of FIGS. 1A and 1B, and ultimately device failure. This can result in lowered yield rates of the integrated circuits manufactured using conventional gapfill processes.

Figure 2A:
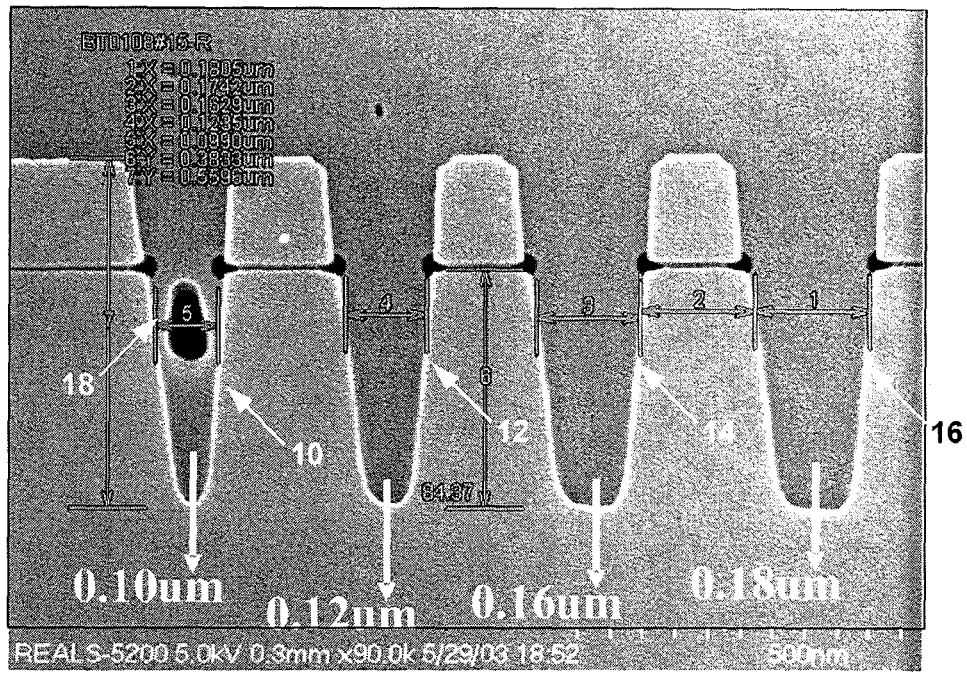
FIGS. 2A and 2B are SEM images showing void formation in a conventional STI process.
Figure 2B:
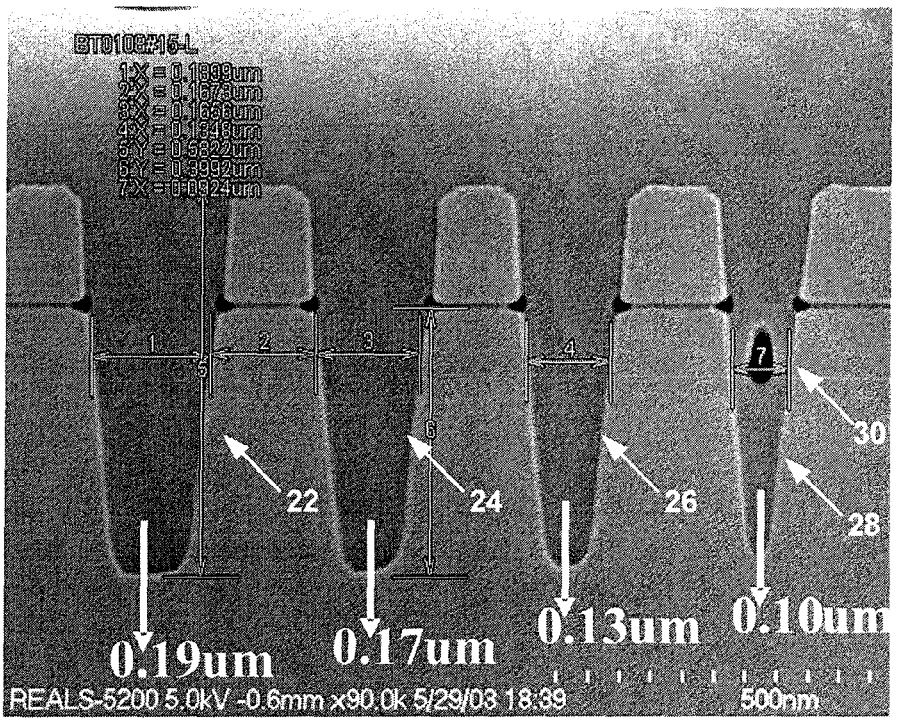

FIGS. 2A and 2B are SEM images showing void formation in a conventional STI process. An STI process is commonly used during wafer processing to electrically isolate adjacent transistors formed on a common semiconductor substrate. For example, in FIG. 2A, trenches 10, 12, 14, 16 are shown having varying widths between 0.10 μm for trench 10, 0.12 μm for trench 12, 0.16 μm for trench 16, and 0.18 μm for trench 16. Trenches 12, 14, and 16 can be filled using conventional HDP-CVD processes and do not exhibit voiding. However, due to the reduced width of trench 10, voiding 18 occurs within the trench as a result of the increased aspect ratio of the trench and the limitations of the HDP-CVD process when filling a trench of a reduced size. FIG. 2B similarly shows no problems when a conventional HDP-CVD process is used to fill trenches 22, 24, 26 having widths greater than 0.10 μm, but voiding 30 occurs within trench 28 which has a reduced trench width of 0.10 μm.

Figure 3:
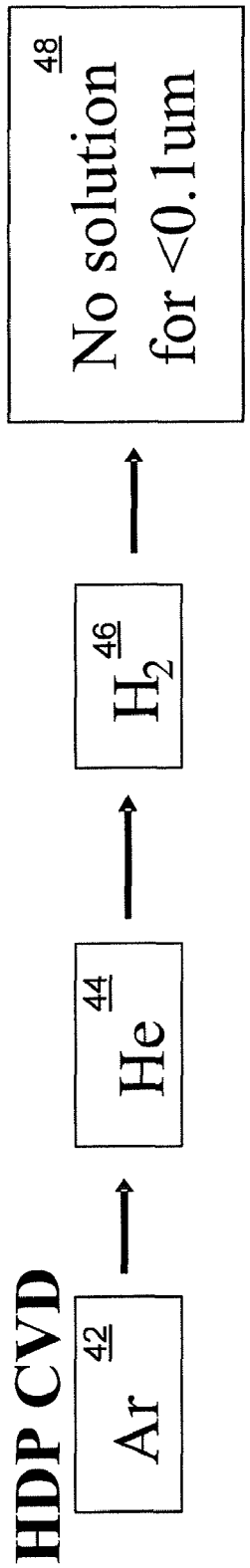
FIG. 3 is a diagram showing chemistries used in HDP-CVD gapfill processes.

FIG. 3 is a diagram showing chemistries used in HDP-CVD gapfill processes. For example, a variety of different chemistries may be employed for an HDP-CVD process. Argon is generally employed for up to an including the 130 nm process node, while Helium may be used for nodes between 130 nm and 90 nm. Hydrogen chemistry is generally employed for processes between 90 nm and 60 nm, but may not be able to fill trenches possessing a width of 0.10 μm and below and having an aspect ratio of 4.5-6. As a result, a new trench fill process may be needed to fill trenches having a reduced trench width which cannot be filled by conventional processes.

Figure 4:
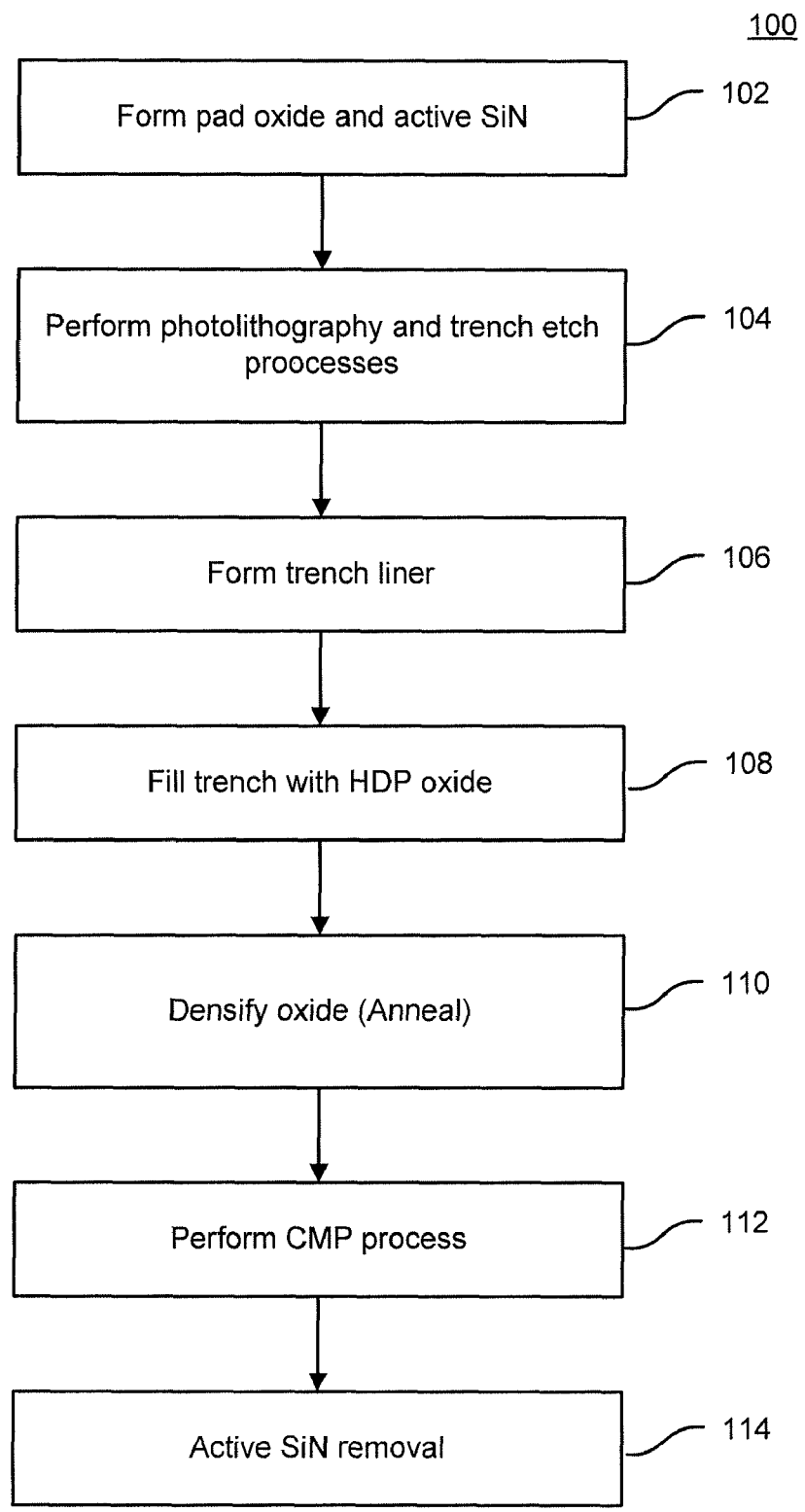
FIG. 4 is a process flow of a conventional STI gapfill process.
Figure 5A:
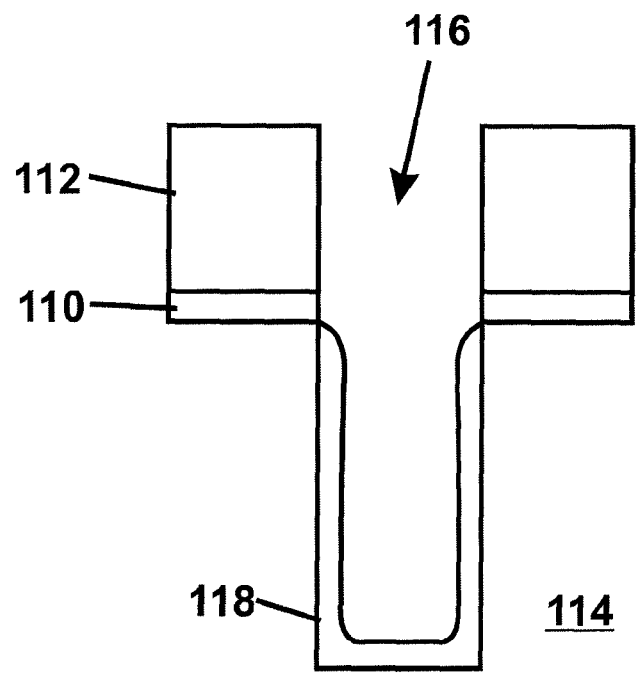
FIG. 5 is a diagram of a conventional STI gapfill process.

FIG. 4 is a process flow of a conventional STI gapfill process. In addition, FIG. 5 is a diagram of a conventional STI gapfill process that may be viewed in conjunction with FIG. 4. Process flow 100 begins with the formation of a pad oxide layer 110 and active SiN layer 112 over substrate 114 in process 102. The active SiN layer may be used as an etch/planarization stop layer in subsequent processes. Additionally, other materials could also be used as the etch/planarization stop layer in place of active SiN layer 112. In process 104, photolithography and etch processes are performed to form a trench 116 within substrate 114. For example, trench 116 may extend 2500-5000 Å into the substrate. A trench liner 118 is then formed lining the sidewalls and bottom of trench 116 in process 106. The result of these processes is shown in FIG. 5A.

Figure 5B:
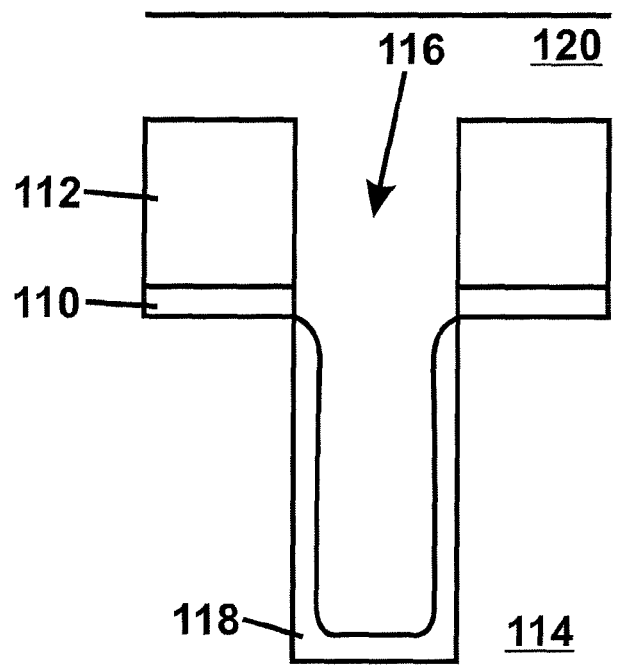

In process 108, trench 116 is filled with oxide 120 using an HDP-CVD process 108. For example, oxide layer 120 may fill the entirety of trench 116 and extend over pad oxide layer 110 and active SiN layer 112. Following the deposition of oxide layer 120, a densification process may be performed to densify the oxide layer 120 and to improve the characteristics of oxide layer 120 as an insulation material in process 110. A thermal anneal process may be used as the densification process by subjecting the oxide layer to high temperatures within a furnace or rapid thermal processing (RTP) tool. The result of these processes is shown in FIG. 5B.

Figure 5C:
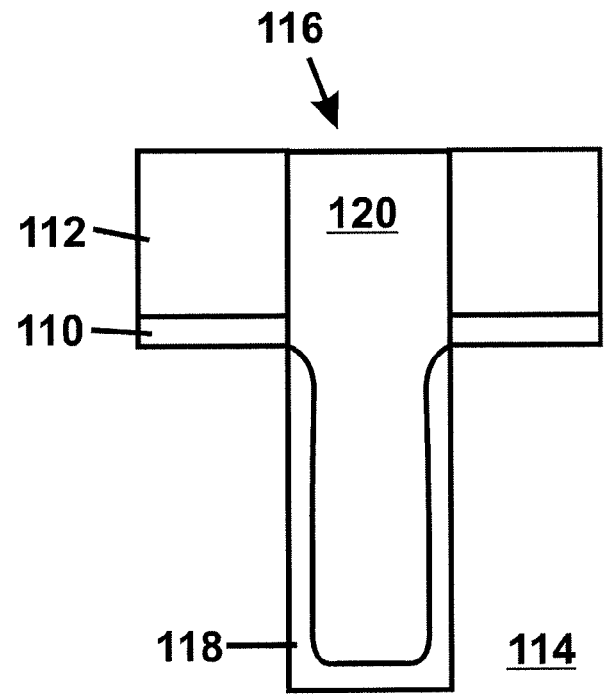
Figure 5D:
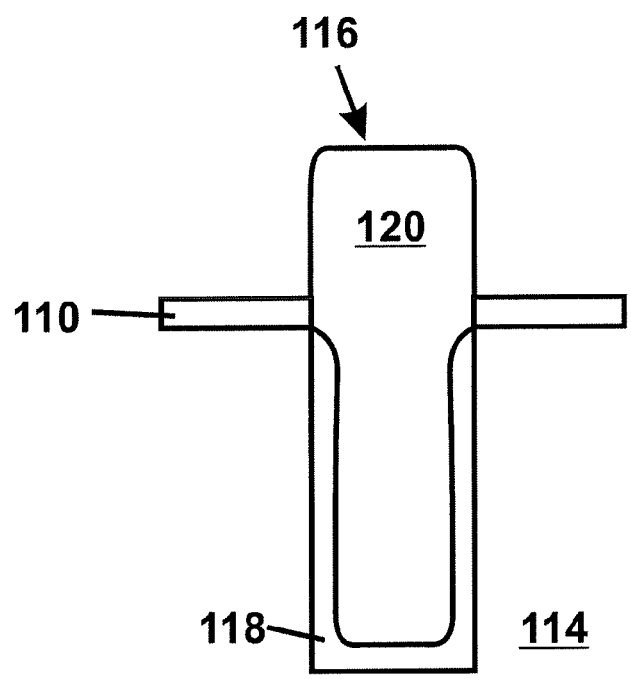

In process 112, a chemical-mechanical polishing (CMP) process is performed to planarize and smooth deposited oxide layer 120. Active SiN layer 112 may be used as a stop layer during this process, which allows for the amount of oxide layer 120 removed to be controlled by the height of active SiN layer 112. The height of oxide layer 120 is etched back to be even with active SiN layer 112. The result of these processes is shown in FIG. 5C. In process 114, active SiN layer 112 is removed using a nitride strip process. This leaves trench 116 filled with oxide 120 and a silicon area 114 between the trenches ready for transistor formation in subsequent processes, as shown in FIG. 5D.

However, as shown in FIGS. 2A-2B, using a conventional HDP-CVD process to fill trenches having a width of 0.1 μm can result in voiding within the trenches. Due to the inability of conventional trench gapfill processes to full trenches having a width of 0.1 μm or smaller, a new trench fill process is needed that can fill trenches having a width of 0.1 μm or smaller that does not form voids within the trenches.

Figure 6:
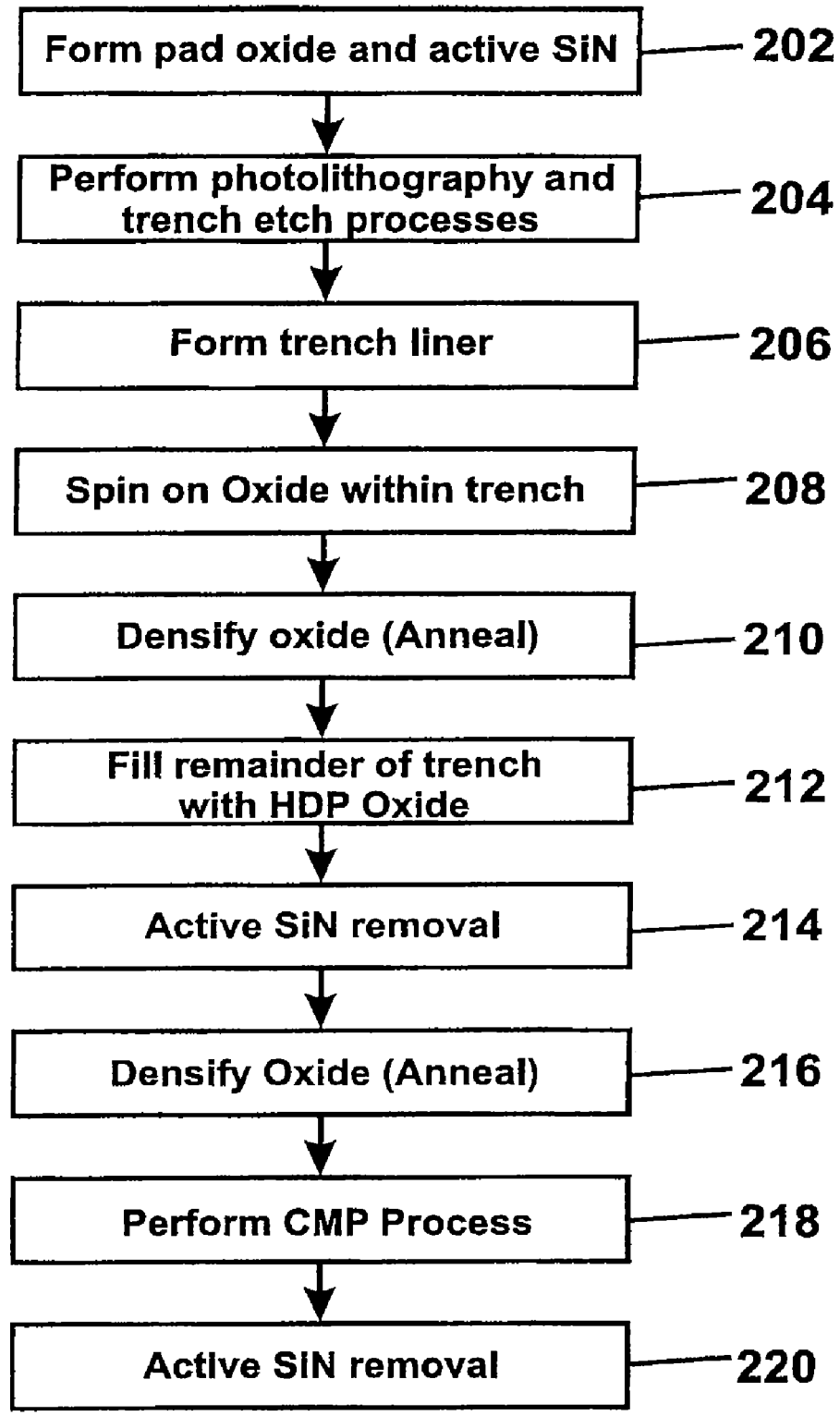
FIG. 6 is an exemplary simplified process flow showing a spin-on/HDP-CVD gapfill process according to an embodiment of the present invention.

FIG. 6 is an exemplary simplified process flow showing a spin-on/HDP-CVD gapfill process according to an embodiment of the present invention. Process flow 200 includes process 202 for forming a pad oxide and active SiN layer, process 204 for performing photolithography and trench etch processes, process 206 for forming a trench liner, process 208 for forming a spin-on oxide within the trench, process 210 for performing a first densification process on the oxide layer, process 212 for filling the remainder of the trench with HDP oxide, process 214 for removing a portion the active SiN layer, process 216 for performing a second densification process on the oxide layer, process 218 for performing a chemical-mechanical polishing (CMP) process, and process 220 for removing the remainder of the active SiN layer. Depending upon the application, certain steps may be combined or even separated. Certain steps may be performed in other order or sequence also depending upon the embodiment. Other steps may be added or steps may be omitted depending upon the embodiment. These and other details are found throughout the present specification and more particularly below. For example, FIG. 6 may be viewed in conjunction with FIGS. 7A-7E, which are exemplary simplified diagrams of a spin-on/HDP-CVD gapfill process according to an embodiment of the present invention. These diagrams are merely examples, which should not unduly limit the scope of the claims. One of ordinary skill in the art would recognize many variations, alternatives, and modifications.

Figure 7A:
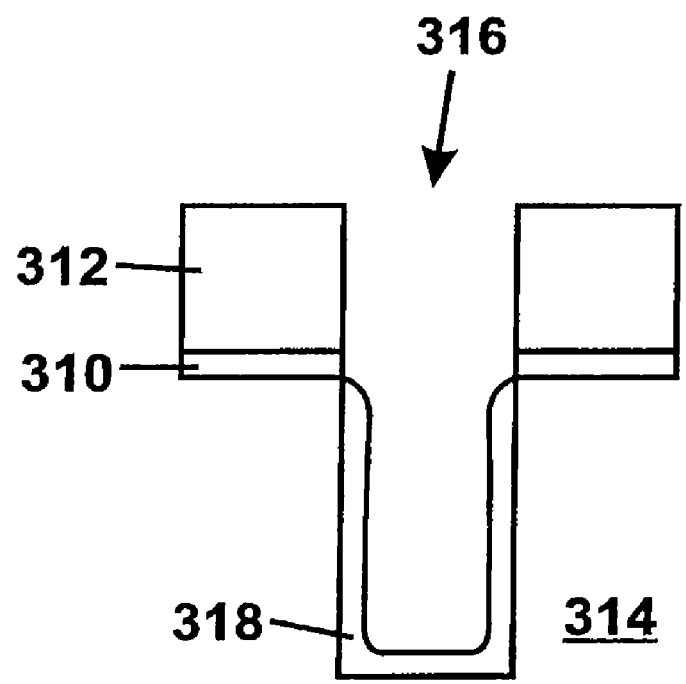
FIGS. 7A-7E are exemplary simplified diagrams of a spin-on/HDP-CVD gapfill process according to an embodiment of the present invention.
Figure 7B:
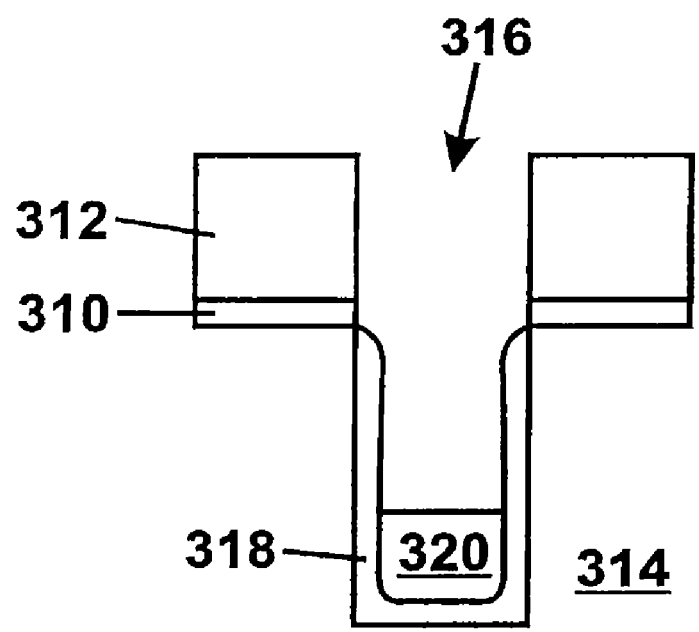
Figure 7C:
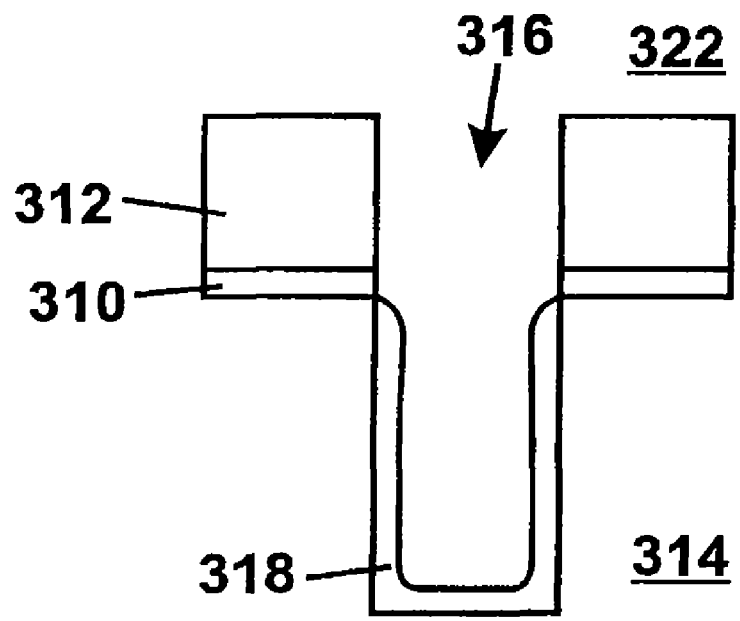

Process flow 200 begins with the formation of a pad oxide layer 310 and active SiN layer 312 over substrate 314 in process 202. The active SiN layer may be used as an etch/planarization stop layer in subsequent processes. Additionally, other materials could also be used as the etch/planarization stop layer in place of active SiN layer 312. In process 204, photolithography and etch processes are performed to form a trench 316 within substrate 314. For example, trench 316 may extend 2500-5000 Å into the substrate. A trench liner 318 is then formed lining the sidewalls and bottom of trench 316 in process 206. The result of these processes is shown in FIG. 7A. For example, processes 202-206 may be similar to processes 102-106 described in regards to FIG. 4. Of course, there can be other variations, modifications, and alternatives.

In process 208, a spin-on process is used to form an oxide layer 320 within trench 316 that occupies at least a portion of the depth of trench 316. The chemical equation for an exemplary spin-on process is given below:

$$4HSiO_{3/2} \rightarrow 3SiO_2 \text{ (film)} + SiH_4 \text{ (gas)} \qquad (1)$$

The spin-on film can be thermally cured to produce an oxide film and silane gas, which is removed as a byproduct. For example, spin-on oxide layer 320 may occupy 40% of the total trench height. Of course, this ratio may be varied depending upon the specific situation so long as the subsequent HDP-CVD process can deposit oxide without voiding. The advantage of utilizing a spin-on oxide as opposed to conventional deposition processes is that the spin-on glass oxide is a liquid composition that can be applied to the substrate to fill the recessed areas within the trench. Due to its liquid composition of the spin-on glass, it can better fill the corners of the trench and effectively reduce the aspect ratio of the area being filled, so that a subsequent HDP-CVD process can fill the trench. For example, the thickness of spin-on oxide layer 320 may be between 1000-10000 Å. Of course, there can be other variations, modifications, and alternatives.

In process 210, a first densification process is performed to densify oxide layer 320 and improve the characteristics of the oxide layer as an insulation material. A thermal anneal process may be used as the densification process by subjecting the oxide layer to high temperatures. The liquid composition of oxide layer 320 is changed by the densification process to become a solid oxide layer. For example, the first densification process may be performed at a temperature between 500-700 degrees C. for a duration between 30 seconds to 30 minutes within an $N_2$ or $O_2$ ambient. Alternatively, the first densification process could also be performed within an $H_2O$ ambient. The densification process may be performed within a rapid thermal processing (RTP) device or performed within a furnace. Of course, there can be other variations, modifications, and alternatives.

In process 212, the remainder of the trench is filled using a HDP-CVD deposition process to deposit an oxide within the trench. The oxide layer deposited by the HDP-CVD deposition process overlies the oxide layer 320 that was previously deposited using a spin-on process, and may additionally overly the pad oxide 310/active SiN regions 312 on the mesa regions adjacent to trench 316. For example, the HDP-CVD deposition process may be used to deposit varying amounts of oxide within trench 316, so long as trench 316 is filled. Following the HDP-CVD deposition process, a portion of the active SiN layer 312 may be removed in process 214. For example, this process may also remove a portion of oxide layer 322, thus reducing the amount that needs to be removed by a subsequent CMP process. A second densification process may be performed in process 216 to densify the oxide layer deposited by the HDP-CVD process. A thermal anneal process may be used as the densification process by subjecting the oxide layer to high temperatures. For example, the second densification process may be performed at a temperature between 850-1100 degrees C. for a duration between 30 seconds to 30 minutes within an $N_2$ or $O_2$ ambient. Alternatively, the first densification process could also be performed within an $H_2O$ ambient. The densification process may be performed within a rapid thermal processing (RTP) device or performed within a furnace. The result of these processes can be seen in FIG. 7C. Of course, there can be other variations, modifications, and alternatives.

One advantage towards performing the densification steps within ambients is that the post-treatment oxide layers may possess different stress levels that may be more conducive to enhanced device performance, such as increased transistor operating speeds. For example, conventional HDP oxide is compressive (~150-300 MPa compressive), while spin-on oxide is tensile (200-1600 MPa tensile) which may be desirable for creating tensile stress in the channel region of the transistor to improve performance. The tensile stress achieved depends on the ratio of spin-on to HDP oxide used to fill the trench and also on the integration processes such as the anneal/densification processes. In another example, both the first and second densification processes may be performed within an $N_2$ or $O_2$ ambient to achieve films of a compressive stress. Alternatively, both densification processes may be performed within an $H_2O$ ambient to achieve films of a tensile stress. In addition, greater flexibility is offered by using embodiments of the present invention in that either tensile and compressive stresses may be created within the oxide layer, depending upon the specific application. Of course, there can be other variations, modifications, and alternatives.

Table 1 shows hardness values for oxide layers deposited using a variety of methods, including spin-on, HDP-oxide, and a combination of spin-on and HDP oxide.

TABLE 1

|  | | | Spin-on & HDP oxide | | |
| --- | --- | --- | --- | --- | --- |
|  | Spin-on | HDP Oxide | No anneal | One anneal step | 2 anneal steps |
| Hardness (GPa) | 0.16 | 15 | 4 | 8 | 14 |

Due to the liquid composition of spin-on oxide, its hardness value is much lower than that of HDP oxide. In comparison, the hardness of a combination of spin-on and HDP oxide varies greatly depending upon the number or anneal steps performed. If no anneal processes are performed, the oxide layer may have a much lower hardness. However, with subsequent anneal processes, the hardness of a combination spin-on and HDP oxide layer may be close to that of an oxide layer formed solely by HDP-CVD, which may lead to reduced problems with process integration. Of course, there can be other variations, modifications, and alternatives.

Table 2 shows exemplary film stresses for anneal processes performed under different conditions.

TABLE 2

Densification condition: (700-1100 deg C., 30 minutes)

| Type of Anneal | H2O | O2 | N2 | HDP Oxide |
|---|---|---|---|---|
| Film Stress (MPa) | 1200 (tensile) | −300 | −288 | −290 |

The densification process performed within an $H_2O$ ambient exhibits a highly tensile stress, while the densification processes performed within $N_2$ and/or $O_2$ ambients exhibits a compressive stress of a similar value to that of the HDP oxide deposited using a conventional process. For example, the similar film stresses achieved using $H_2$ and/or $O_2$ ambients to a conventional HDP-CVD process may allow for a reduction in problems with process integration. Of course, there can be other variations, modifications, and alternatives.

Figure 7D:
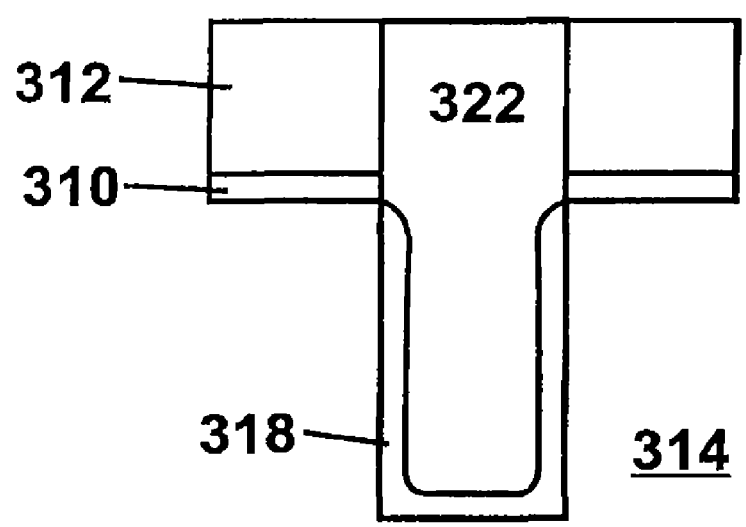
Figure 7E:
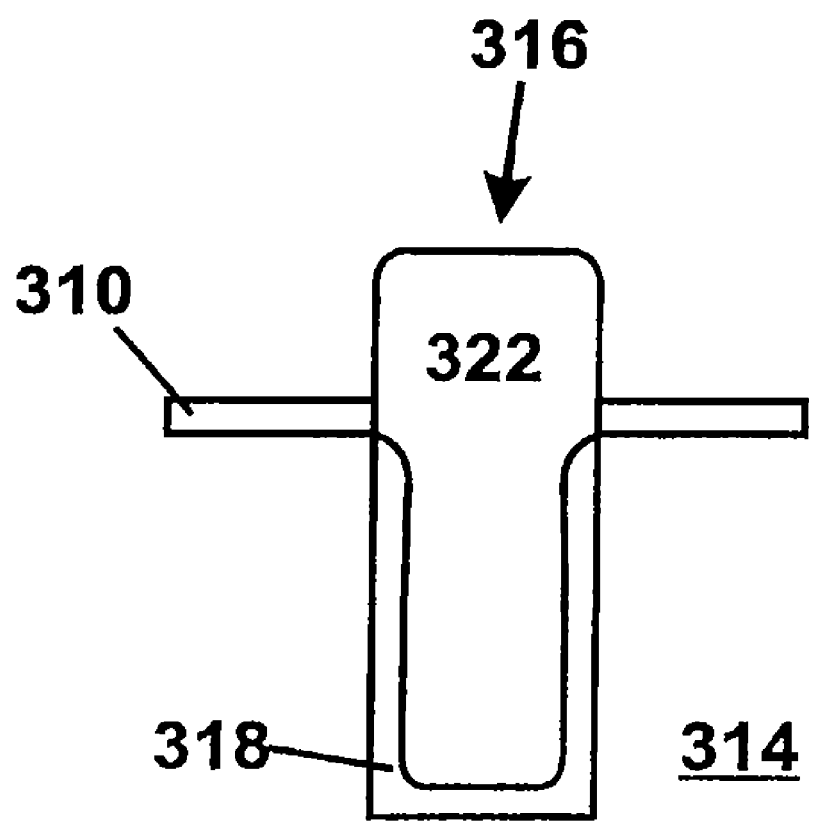

In process 218, a planarization process 218 is performed to remove excess portions of oxide layer 322 from the structure. For example, active SiN layer 312 may be used as the etch/CMP stop for the planarization process, leaving the upper height of oxide layer 322 roughly even with the upper height of active SiN layer 312. The result of planarization process 218 is shown in FIG. 7D. In process 220, the remainder of the SiN layer is removed using a nitride strip process, leaving trench 316 filled with oxide and adjacent to silicon areas that can be used for transistor formation. An pad oxide strip process may also be performed using an oxide strip process following the nitride strip process. Of course, there can be other variations, modifications, and alternatives.

In another embodiment of the present invention, one or more spin-on oxide deposition processes are used to fill the trench, meaning that a HDP-CVD deposition process is not used However, difficulties with process integration may result due to the different film properties of the spin-on oxide vs. the HDP oxide and because the subsequent CMP process may result in delamination or scratches on the surface of the spin-on oxide. Of course, additional processes may be performed to change the film properties of the spin-on oxide to make it more similar to the properties of HDP oxide, but this may add additional process steps to the process flow.

Figure 8A:
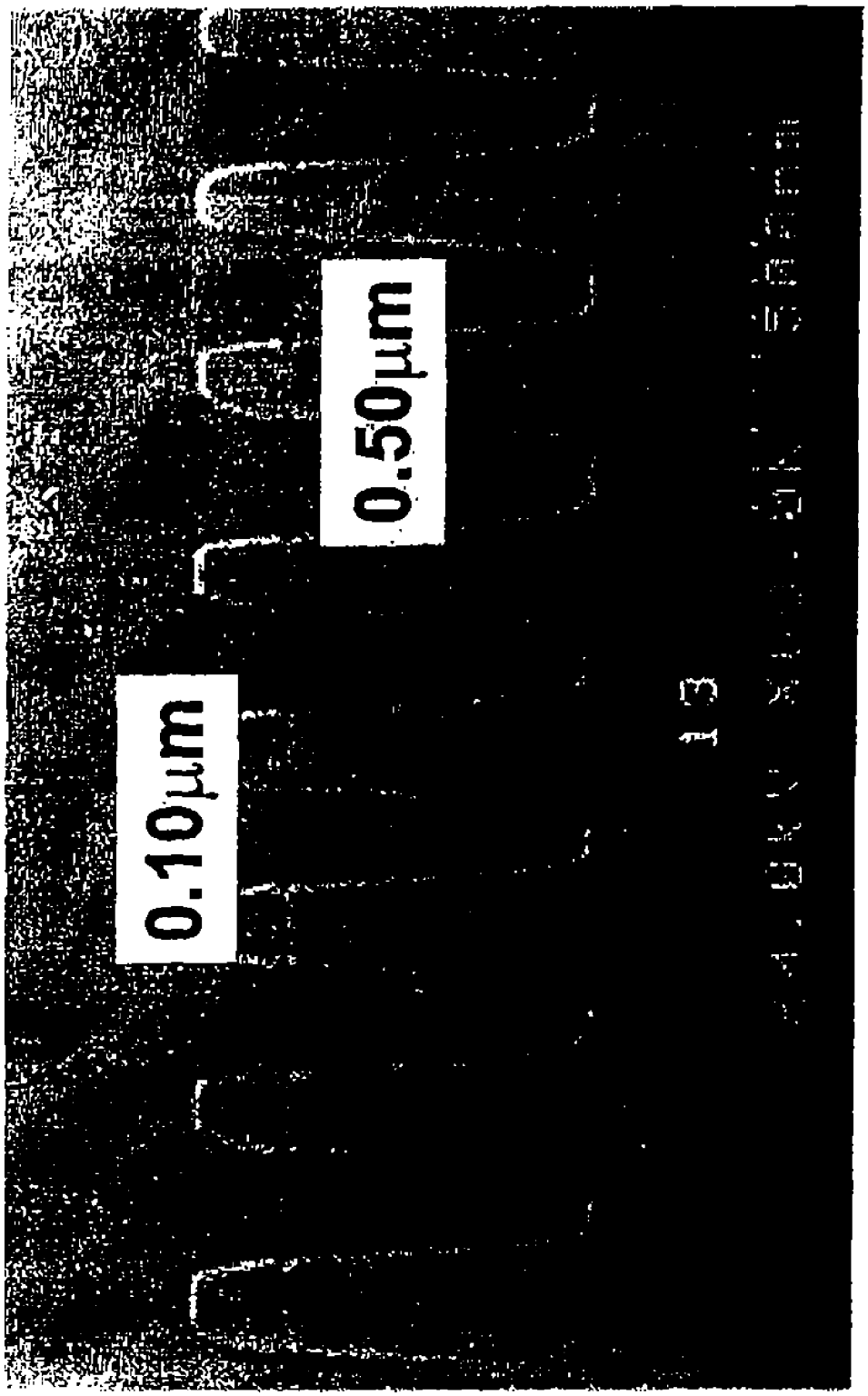
FIGS. 8A-8C are SEM images of trenches filled by a spin-on/HDP-CVD gapfill process according to an embodiment of the present invention.
Figure 8B:
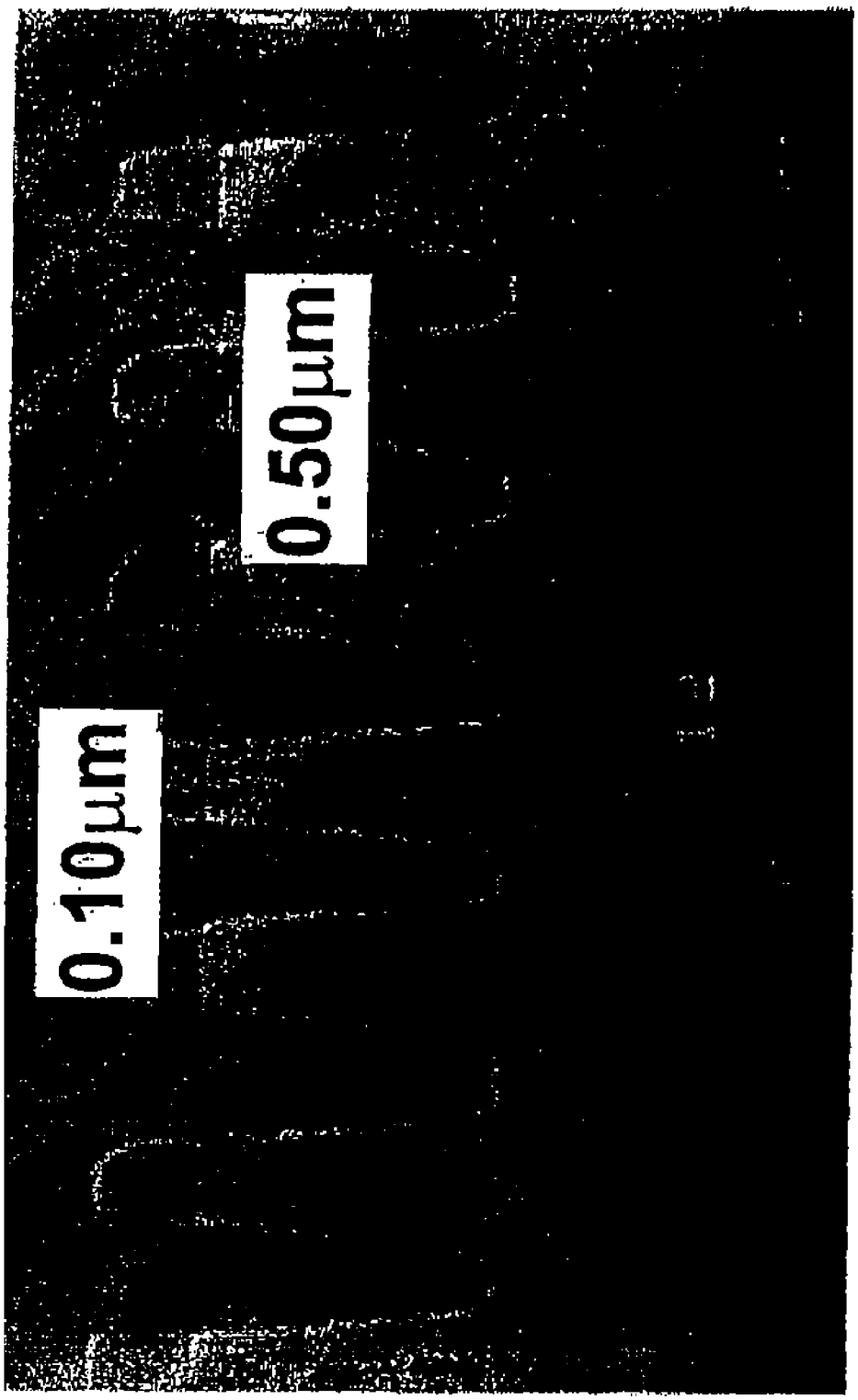
Figure 8C:
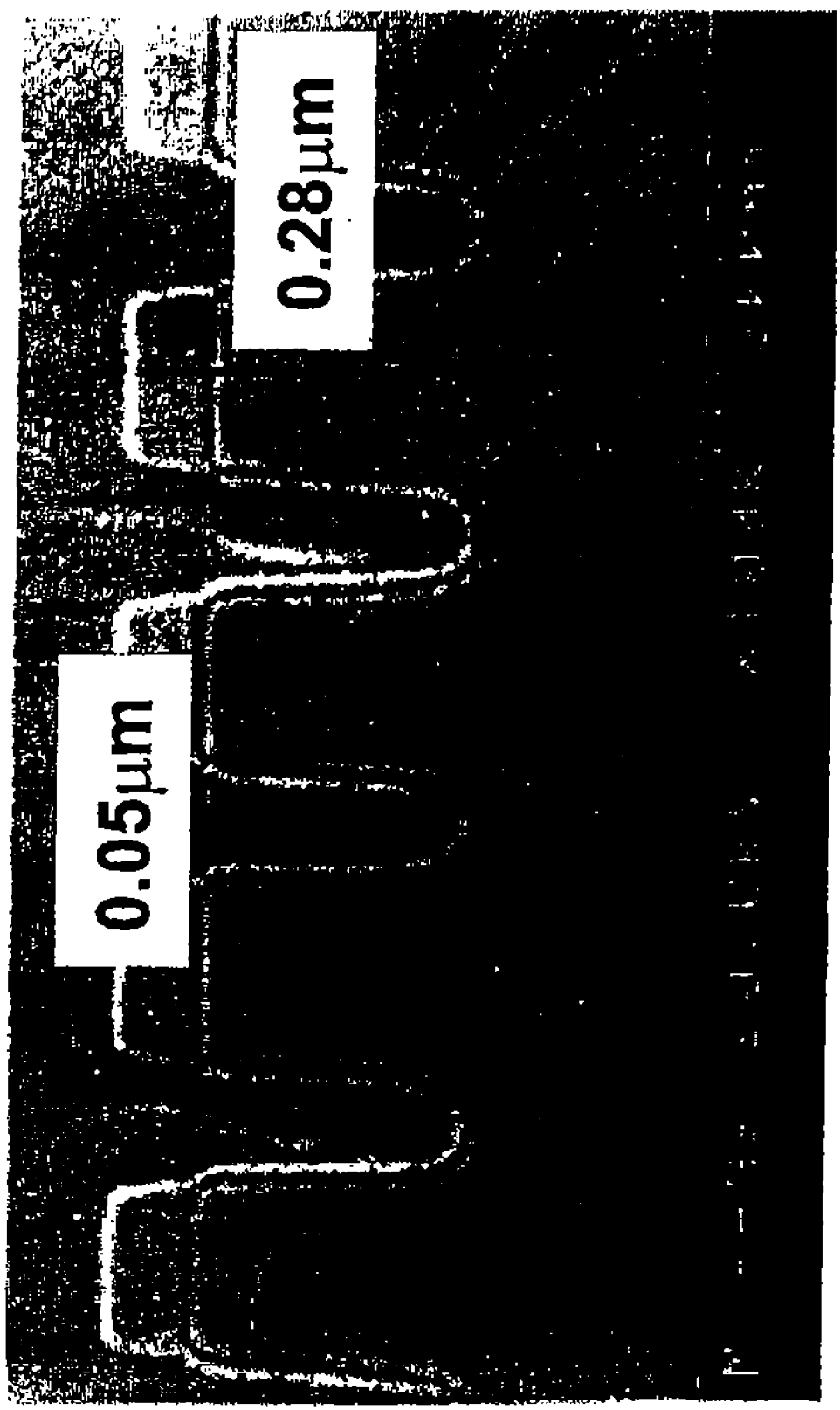

FIGS. 8A-8C are SEM images of trenches filled by a spin-on/HDP-CVD gapfill process according to an embodiment of the present invention. These diagrams are merely examples, which should not unduly limit the scope of the claims. One of ordinary skill in the art would recognize many variations, alternatives, and modifications. FIG. 8A is an example of center view of trenches formed with a 5:1 aspect ratio with a 0.10 µm trench opening, while FIG. 8B is an edge view of the trenches shown in FIG. 8A. The trenches shown in FIGS. 8A and 8B were filled using a spin-on/HDP-CVD process according to an embodiment of the invention and do not exhibit voiding within the trench, despite the reduced width of the trench opening. FIG. 8C is an edge view of trenches formed with a 0.05 µm trench opening that also does not exhibit voiding within the trenches while exhibiting an even smaller trench opening. Of course, there can be other variations, modifications, and alternatives.

Table 3 further shows exemplary properties of a spin-on/HDP oxide layer used within embodiments of the present invention.

| | |
|---|---|
| Material class: | Poly(perhydrosilazane), —(SiH2NH)— Hydrogen silsesquioxane |
| Thickness range: | 1000-8000 Å (2000-3000 rpm) |
| Solid content: | 10% to 40% |
| Gapfill | <0.05 µm |

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for processing semiconductor devices comprising:
   forming a trench within a substrate, the trench having a total height;
   filling 40% or less of the total height of the trench with a first oxide without any subsequent etching, the first oxide being filled using a spin-on process;
   performing a first densification process on the first oxide within the trench;
   depositing a second oxide within the trench using an HDP process to fill at least the entirety of the trench; and
   performing a second densification process on the first and second oxides within the trench.

2. The method of claim 1 further comprising:
   forming a stop layer overlying the substrate; and
   forming a liner within the trench, the liner lining sidewalls and bottom of the trench.

3. The method of claim 2 further comprising:
   performing a planarization process; and
   removing the stop layer.

4. The method of claim 2 wherein the stop layer is silicon nitride.

5. The method of claim 3 further comprising removing a portion of the stop layer following the deposition of oxide within the trench using the HDP process.

6. The method of claim 1 further comprising forming a pad oxide layer overlying the substrate.

7. The method of claim 1 wherein the trench has a width of 0.10 µm of smaller.

8. The method of claim 1 wherein the trench has an aspect ratio of 5:1 or greater.

9. The method of claim 1 wherein one or more of the densification processes may be performed in an N2 and/or O2 ambient to produce an oxide having a compressive stress.

10. The method of claim 1 wherein one or more of the densification processes may be performed in an H2O ambient to produce an oxide having a tensile stress.

11. The method of claim 1 wherein the first densification process is performed at a temperature between 400-800 degrees C. for a duration between 30 seconds to 30 minutes.

12. The method of claim 1 wherein the second densification process is performed at a temperature between 850-1100 degrees C. for a duration between 30 seconds to 30 minutes.

* * * * *